United States Patent [19]

Ferro

[11] 3,909,700

[45] Sept. 30, 1975

[54] MONOLITHIC SEMICONDUCTOR RECTIFIER CIRCUIT STRUCTURE

[75] Inventor: Armand P. Ferro, Schenectady, N.Y.

[73] Assignee: General Electric Company, Schenectady, N.Y.

[22] Filed: Jan. 18, 1974

[21] Appl. No.: 434,580

[52] U.S. Cl. .......... 321/47; 357/15
[51] Int. Cl.² .......... H02M 7/20
[58] Field of Search .......... 321/2, 47; 357/15, 46, 357/48

[56] References Cited

UNITED STATES PATENTS

| | | | |
|---|---|---|---|
| 3,379,940 | 4/1968 | Nakao | 357/46 |
| 3,649,883 | 3/1972 | Augustine | 357/15 |
| 3,735,235 | 5/1973 | Hamilton et al. | 321/2 |
| 3,737,742 | 6/1973 | Breuer et al. | 357/15 |
| 3,751,726 | 8/1973 | Einthoven | 357/46 |
| 3,795,846 | 3/1974 | Ogawa | 357/46 |

OTHER PUBLICATIONS

"Integrated Circuits," J. Millman et al., from text Electronic Devices & Circuits, McGraw-Hill, Inc., 1967, pp. 418–421.

*Primary Examiner*—R. N. Envall, Jr.
*Attorney, Agent, or Firm*—Stephen B. Salai; Joseph T. Cohen; Jerome C. Squillaro

[57] ABSTRACT

A monolithic semiconductor rectifier circuit structure incorporating two npn power transistors and two Schottky-barrier diodes is disclosed. The transistors are connected in an inverted mode and are the main rectifying elements. The Schottky-barrier diodes are connected between the emitters and collectors of the respective transistors and help to initiate rapid turn-on of the transistors. The Schottky-barrier diodes have a relatively low forward voltage drop and their reverse recovery currents are substantially zero. Thus, the Schottky diodes operate with minimum power loss. The monolithic circuit structure may be combined with a discrete current transformer unit to form a hybrid rectifying circuit.

2 Claims, 2 Drawing Figures

MONOLITHIC SEMICONDUCTOR RECTIFIER CIRCUIT STRUCTURE

CROSS-REFERENCE TO RELATED PATENT APPLICATION

A related co-pending U.S. Pat. application Ser. No. 416,115, filed 15 Nov. 1973, in behalf of the same inventor in whose behalf this patent application is filed, titled BIPOLAR MONOLITHIC SEMICONDUCTOR CIRCUIT STRUCTURE, discloses a monolithic circuit structure incorporating a pair of npn power transistors in inverted mode electrical connections for rectifying a.c. and a pair of pn junction diodes for helping to initiate rapid turn-on of the rectifying transistors. The monolithic semiconductor circuit structure herein disclosed represents an improvement over the circuit structure disclosed in the aforesaid earlier-filed patent application Ser. No. 416,115.

The entire right, title and interest in and to the invention described in the aforesaid patent application, as well as in and to the aforesaid patent application, and the entire right, title and interest in and to the invention hereinafter disclosed, as well as in and to the patent application of which this specification is a part, are assigned to the same assignee.

BACKGROUND OF THE INVENTION

The subject invention pertains, in general, to a full-wave rectifier circuit comprising a pair of npn power transistors, electrically connected for inverted mode operation and serving as the main rectifying elements, and an associated pair of Schottky-barrier diodes for helping to initiate rapid turn-on of the transistors; and, in particular, to a monolithic semiconductor structure, incorporating said pairs of transistors and Schottky-barrier diodes, which is adapted for being combined with a discrete multi-winding current transformer unit so as to form a hybrid rectifier circuit.

There are many applications which require a small volume, lightweight, power supply unit including a rectifier. For example, such a power supply unit may be incorporated in a conventional two, or three, conductor line cord at one end of the cord and incorporated in a male plug adapted for connection with a wall receptacle which is, in turn, connected to a single phase, 60 Hertz source of 120 volts. The power supply unit converts, or changes, the supplied phase, frequency and voltage to suit the appliance(s) which are intended to be connected to the end of the line cord. The described assembly is often called a line cord power supply. The power supply itself is a small, compact, lightweight unit which is usually integral with the line cord and is supported by the line cord.

The small volume, lightweight power supply unit, hereinbefore discussed, includes a rectifier circuit. The rectifier circuit must be of small volume and it must be lightweight. Another important requirement respecting such rectifiers is that high efficiency rectification be achievable. Furthermore, rectifier operation should be stable for long periods of time, even under adverse ambient temperatures and humidity. In addition, such rectifiers should be relatively inexpensive.

The aforementioned requirements have not been satisfactorily met in cases where such rectifiers are intended to operate at relatively low voltages, relatively high currents and relatively high frequencies (e.g., 10 volts or less, up to several amperes and up to 50 kilohertz). Known efforts employing such passive rectifying elements, or devices, as bipolar silicon diodes and bipolar germanium diodes have not proved entirely satisfactory. For example, a simple, full-wave rectifier circuit using silicon diodes exhibits poor rectification efficiency where the load voltage is below 10 volts. The poor efficiency is due to the inherent forward voltage drop of a silicon junction which, for low cost diodes, is about 1 volt at 1 ampere when the silicon diodes are operating near their ratings. Also, additional power dissipation in the form of switching losses occurs due to high frequency operation; the high frequency being necessary for the employment of minimum volume magnetic components which are necessary in other parts of the rectifier circuit. As another example, germanium diodes are not generally suited for rectification at high frequencies.

The use of active devices, such as transistors, as rectifying elements is also known. See for example, the article "New Techniques In Power Control" by J. B. Gunn, Digest of Technical Papers, 1970 IEEE International Solid State Circuit Conference, at pages 90 and 91. As other examples, see the related co-pending U.S. Pat. applications: Ser. No. 406,162, filed 15 Oct. 1973, in behalf of J. N. Park, R. L. Steigerwald and L. H. Walker, titled RECTIFIER CIRCUITS USING TRANSISTORS AS RECTIFYING ELEMENTS; and, Ser. No. 416,115, filed 15 Nov. 1973, in behalf of the same Armand P. Ferro in whose behalf this patent application is filed, titled BIPOLAR MONOLITHIC SEMICONDUCTOR CIRCUIT STRUCTURE. The patent applications hereinbefore identified, as well as the inventions therein disclosed, are assigned to the same assignee of the invention herein disclosed.

The monolithic semiconductor rectifier circuit structure herein disclosed represents a departure from the rectifier disclosed in the Gunn article, hereinbefore identified, and also represents an improvement over the inventions disclosed in the patent applications (Ser. No. 406,162 and Ser. No. 416,115) hereinbefore identified.

SUMMARY OF THE INVENTION

One object of the invention is to provide a monolithic structure, comprising a pair of power transistors and an associated pair of Schottky-barrier diodes, suitable for being combined with a discrete current transformer unit to form an improved full-wave rectifier circuit similar to the full-wave rectifier circuit disclosed in U.S. Pat. application Ser. No. 406,162, hereinbefore more completely identified.

Another object of the invention is to provide a monolithic structure, comprising a pair of power transistors and an associated pair of Schottky-barrier diodes, suitable for being combined with a discrete current transformer unit to form a full-wave rectifier circuit which represents an improvement over the full-wave rectifier circuit disclosed in U.S. Pat. application Ser. No. 416,115.

Another object of the invention is to provide a semiconductor structure incorporating the aforesaid power transistors and Schottky-barrier diodes on a single chip.

Another object of the invention is to provide a full-wave rectifier comprising a hybrid circuit comprising the aforesaid monolithic semiconductor structure and a discrete transformer unit including, preferably on a single magnetic core, two primary and two secondary windings.

In an exemplary embodiment of the invention there is provided a monolithic semiconductor structure in which there is incorporated a pair of npn junction transistors and a pair of Schottky-barrier diodes. The semiconductor structure is especially, but not solely, suitable for being combined with a discrete multi-winding single-core current control transformer unit and forming a hybrid circuit similar to the rectifier circuits disclosed in U.S. Pat. applications Ser. Nos. 406,162 and 416,115, hereinbefore more completely identified. The aforesaid monolithic semiconductor structure is comprised of: An $n^+$ doped substrate having first and second back-to-back surfaces; an n doped layer epitaxially grown on the first surface of the substrate, said layer having a surface in back-to-back relationship with the first surface of the substrate on which said layer is grown; first and second laterally spaced p doped regions diffused into said layer and extending from said surface of said layer toward, but not meeting, the first surface of the substrate on which said layer is grown; first and second $n^+$ doped regions diffused into said first and second p doped regions, respectively, each $n^+$ doped region extending from the surface of the p doped region into which it is diffused toward, but not meeting, an interface between said p doped region and said n doped layer; and, first and second laterally spaced metallization regions in intimate contact with said surface of said n doped layer and forming thereat first and second metal-semiconductor junctions, said first and second metallization regions comprising anodes of first and second Schottky-barrier diodes, respectively; said first and second $n^+$ doped regions comprising emitters of first and second npn transistors, respectively; said first and second p doped regions comprising bases of said first and second npn transistors, respectively; and, said second surface of said $n^+$ doped substrate comprising common collectors of said first and second npn transistors as well as common cathodes of said first and second Schottky-barrier diodes.

The monolithic semiconductor structure hereinbefore described may also include guard rings encompassing the metal-semiconductor junctions of said Schottky-barrier diodes, said guard rings comprising additional p doped regions diffused into said *n* doped layer and extending from the surface of said n doped layer toward, but not meeting, said first surface of said substrate on which said n doped layer is epitaxially grown. The guard rings enable the Schottky-barrier diodes to have nearly the same breakdown voltages as the base-collector junctions of the transistors with which they are associated. More particularly, the guard rings serve to compensate for the electric field configurations produced by the first and second metallization regions (anodes) which comprise the Schottky-barrier diodes. However, as an alternative, a mesa etch technique may be employed in applying the first and second metallization regions (anodes) to the surface of the n doped layer for the purpose of forming first and second metal-semiconductor junctions of the first and second Schottky-barrier diodes. As a result, the two Schottky-barrier diodes and the base-collector junctions of the transistors with which said diodes are associated have compatible breakdown voltages.

Furthermore, the monolithic semiconductor structure hereinbefore described may also include isolation regions comprising additional $n^+$ doped regions diffused into the n doped layer and extending from the surface of said layer toward, but not meeting, the first surface of said substrate; said additional $n^+$ doped regions encompassing the first and second p doped regions as well as the additional p doped regions which form the aforementioned guard rings. The regions formed by the additional $n^+$ doped regions effectively enable rapid recombinations of electrons and holes and also serve, inter alia, as a channel stopper for the monolithic semiconductor structure.

Thus, one feature of the invention relates to the inclusion in a monolithic structure of a pair of metal-semiconductor junctions with an associated pair of npn power transistors; the emitter and collector of each transistor having a metal-semiconductor junction of a Schottky-barrier diode electrically connected therebetween.

Another feature of the invention relates to the fabrication of npn power transistors in the aforesaid monolithic semiconductor structure so that said transistors may be operated in an inverted mode; i.e., so that current is into the emitter and out of the collector of each transistor and voltage blocking is performed by the collector-base junctions of the transistors.

Another feature of the invention relates to the combination of the aforesaid monolithic semiconductor structure, incorporating power transistors and Schottky-barrier diodes, with a discrete multi-winding transformer unit so as to form a hybrid circuit useful in, among other circuits, the full-wave rectifier circuits disclosed in U.S. Pat. applications, Ser. Nos. 406,162 and 416,115.

Other objects, as well as other features and advantages of the invention appear hereinafter whereat at least one exemplary embodiment of the invention is disclosed for the purpose of illustrating the invention; said disclosure including the accompanying drawing figures, the content of which is hereinafter described.

DRAWINGS

DETAILED DESCRIPTION

Figure 1:
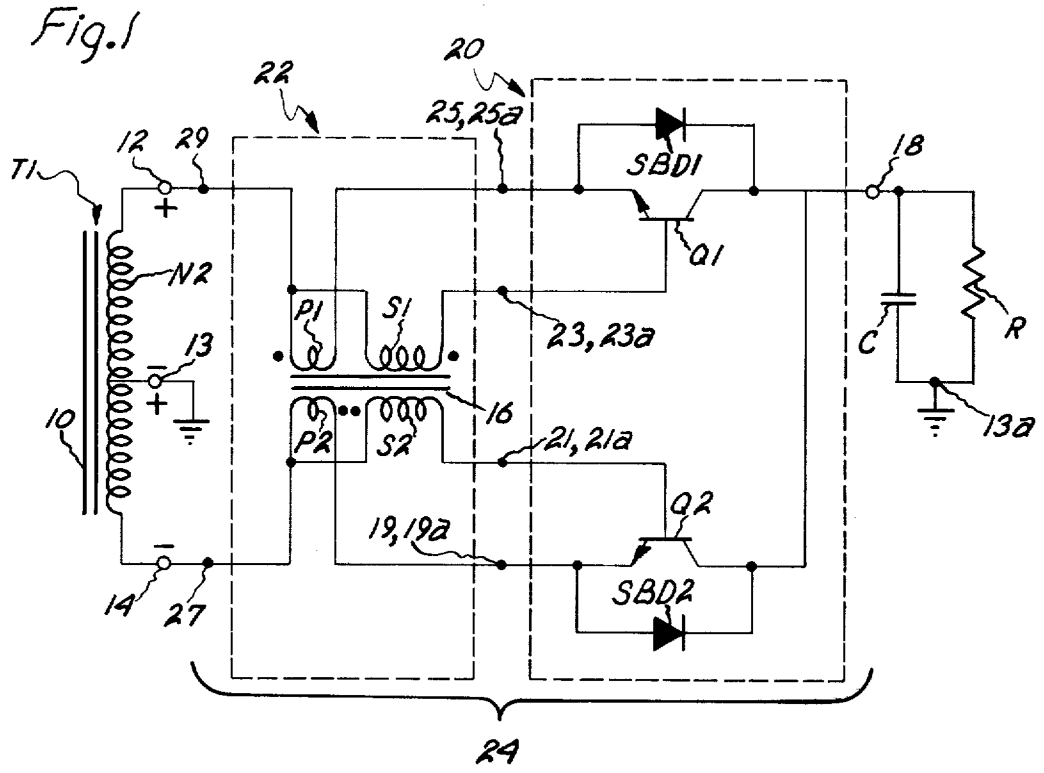
FIG. 1 is a schematic diagram of a full-wave rectifier circuit including the invention.

The full-wave rectifier circuit shown at FIG. 1 is similar to that fully disclosed in U.S. Pat. applications Ser. Nos. 406,162, filed 15 Oct. 1973, and 416,115, filed 15 Nov. 1973. As indicated at FIG. 1, a monolithic semiconductor structure is designated, generally, by the reference number 20. The single-chip semiconductor structure 20 (which is disclosed in more detail at FIG. 2) incorporates two npn power transistors Q1 and Q2 as well as two Schottky-barrier diodes SBD1 and SBD2. The single-chip structure 20 is electrically combined with a discrete single-core multi-winding current control transformer unit designated, generally, by the reference number 22. As indicated, the monolithic structure 20 and the discrete transformer unit 22 are combined to form a hydrid circuit structure designated, generally, by the reference number 24.

The discrete transformer unit 22 includes a first set of primary and secondary windings P1 and S1, respectively, as well as a second set of primary and secondary windings P2 and S2, respectively. In addition, a single, closed, magnetic core member 16 is provided. The windings P1, S1, P2 and S2 are wound, and are magnetically coupled, on the same core member 16. The ends of the various windings have the winding polarity markings indicated by the black dots at FIG. 1. Because the rectifier circuit of FIG. 1 is intended for handling relatively high frequencies (up to 50 kilohertz) the core member 16 is, preferably, of ferrite material.

As indicated at FIG. 1, the hybrid circuit structure 24 is connectable between a transformer T1 and a parallel RC combination. The resistance element R, alone, or the combination of the resistance element R with a capacitor C may form the load. Transformer T1 includes a ferrite core member 10 on which there is wound a primary winding (not shown) and a secondary winding N2. The secondary winding N2 includes a center tap terminal 13 which is arranged between the terminals 12 and 14, at the opposite ends of winding N2. As indicated, the center tap 13 is grounded. Similarly, one end of the parallel RC combination is also grounded at a terminal 13*a*.

As indicated at FIG. 1, the monolithic structure 20 has five terminals, or contact elements, extending therefrom which are designated by the reference numbers 18, 19, 21, 23 and 25. Also, the discrete transformer unit 22 has six terminals, or contact elements, extending therefrom which are designated by the reference numbers 19*a*, 21*a*, 23*a*, 25*a*, 27 and 29.

As shown at FIG. 1, some of the terminals are commonly connected: 19 and 19*a*; 21 and 21*a*; 23 and 23*a*; 25 and 25*a*; 29 and 12; 27 and 14; and, terminal 18 is connected to another end terminal, or node, of the parallel RC combination.

The operation of the full-wave rectifier circuit of FIG. 1 is generally described in U.S. Pat. applications Ser. Nos. 406,162 and 416,115. However, the use of Schottky-barrier diodes SBD1 and SBD2, provides the advantages hereinafter disclosed. Briefly, an initial, or starting, current is from positive terminal 12, through winding P1, through Schottky-barrier diode SBD1 (from anode to cathode), into terminal 18, through the parallel RC combination, and into ground terminal 13*a*. Transistors Q1 and Q2 are initially OFF while the diode SBD1 conducts the aforesaid starting current. Diode SBD2 is blocking because the voltage at its cathode is more positive than that at its anode. Since the aforesaid starting current is also in the primary winding P1, the secondary winding S1 develops a current which is into the base of transistor Q1. Eventually, transistor Q1 turns ON thereby shunting Schottky-diode SBD1 so that the diode turns OFF. Transistor Q1 operates in an inverted mode; i.e., current is into its emitter and out of its collector. The transistor Q2 is OFF. Moreover, the collector-base junction of transistor Q2 performs a voltage blocking function thereby preventing conduction between the positive going terminal 18 and the negative terminal 14. Eventually, terminal 12 becomes less positive than terminal 18 due to diminishing of the positive voltage at terminal 12. As a result, current discharged from capacitor C and terminal 18 is into the collector of transistor Q1; and, current is out of the emitter of transistor Q1. The current out of the emitter of transistor Q1 is in the winding P1. As a result of reverse current flow through winding P1, the secondary winding S1 acts to reverse the base current of transistor Q1 such that base current is out of transistor Q1. The current out of the base of transistor Q1 initiates a rapid turn OFF of transistor Q1. Subsequently, when terminal 14 becomes positive with respect to terminals 13 and 12 the Schottky-barrier diode SBD2 conducts starting current to terminal 18 and the parallel RC combination. The aforesaid starting current in Schottky-barrier diode SBD2 is also in the primary winding P2 and causes the secondary winding S2 to develop a base current into the base of transistor Q2 thereby turning transistor Q2 ON. The transistor Q2 is also arranged for inverse mode conduction; i.e., current is into the emitter of transistor Q2 and current is out of the collector of transistor Q2. While transistor Q2 is conducting as aforesaid, the collector-base junction of transistor Q1 is performing a voltage blocking function.

In the aforesaid sequence of operations the Schottky-barrier diode SBD1 turns OFF as transistor Q1 turns ON. Similarly, the Schottky diode SBD2 turns OFF as transistor Q2 turns ON. The turn OFF of Schottky diodes SBD1 and SBD2 is occasioned by the shunting action of transistors Q1 and Q2, respectively.

The use of Schottky-barrier diodes, SBD1 and SBD2, is advantageous because such diodes have lower forward voltage drops than comparable pn junction diodes. Furthermore, Schottky diodes have reverse recovery currents which are substantially zero whereas the pn junction diodes ordinarily have significant reverse recovery currents. Thus, the use of Schottky-barrier diodes enables circuit operation with minimum power dissipation.

Figure 2:
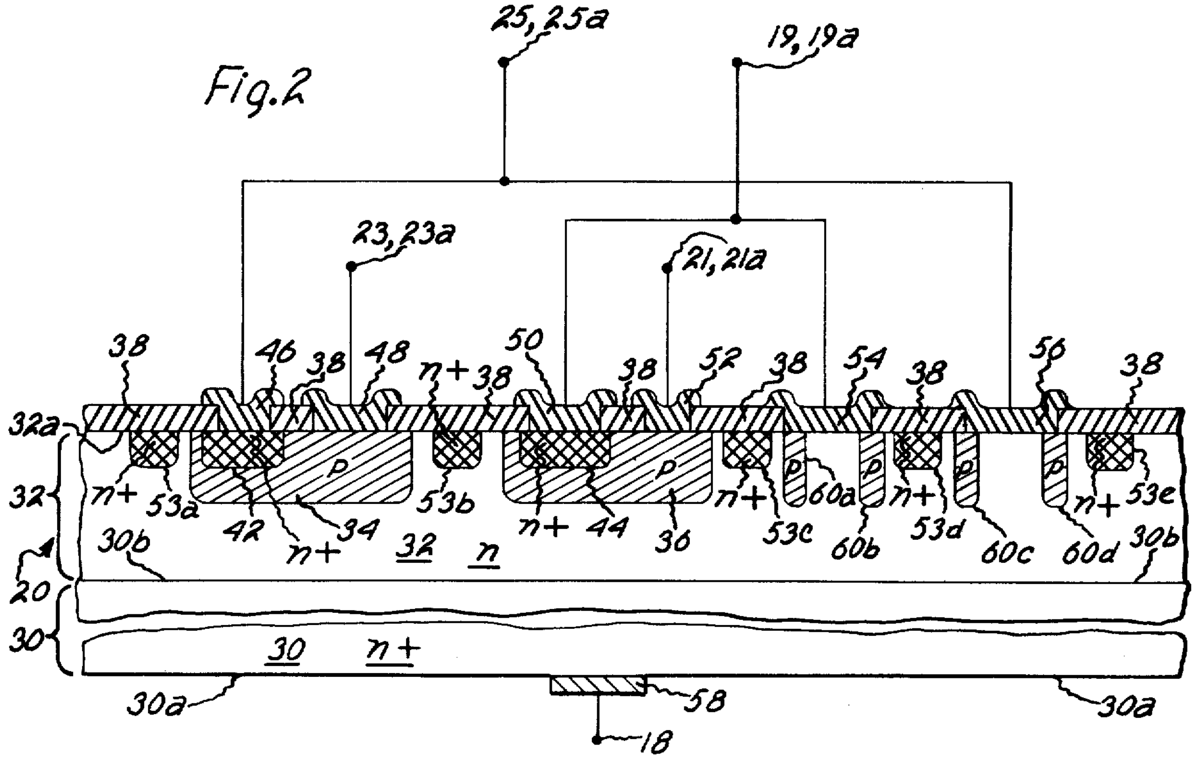
FIG. 2 is a cross section view of a monolithic semiconductor structure incorporating a pair of npn power transistors and an associated pair of Schottky-barrier diodes.

FIG. 2 shows a cross section view of the monolithic structure 20. As indicated, the monolithic structure 20 is comprised of a substrate 30. The substrate 30 is a relatively thick, relatively low resistivity body of $n^+$ doped material. As indicated, the $n^+$ doped substrate 30 has two back-to-back surfaces, 30*a* and 30*b*, which are separated by the thickness dimension of the substrate. A relatively thin, n doped layer 32 is epitaxially grown on the surface 30*b* of the substrate. The n doped layer 32 has a surface 32*a* which is separated by the thickness dimension of the thin layer 32 from the surface 30*b* on which the layer 32 is epitaxially grown. As indicated at FIG. 2, two p doped regions 34 and 36 are diffused into the n doped thin layer 32. Each of the p doped regions 34 and 36 begins at the exposed surface 32*a* of the layer 32 and extends for a substantial distance deeply into the thin layer 32 toward, but not meeting, the surface 30*b* (or, interface between the layer 32 and the substrate 30). Also, the p doped regions 34 and 36 are laterally spaced apart from each other in the thin layer 32. The aforesaid lateral spacings are determined by design considerations; e.g., voltage breakdown, diffusion depths, etc. Each of the p doped regions 34 and 36 includes an $n^+$ doped region, 42 and 44, respectively, diffused therein. As indicated each $n^+$ doped region, 42 and 44, begins at the surface 32*a*, aligned with the surfaces of the p doped regions 34 and 36, and extends for a substantial distance deeply into the p doped regions 34 and 36 toward, but not meeting, the interface between each p doped region, 34 and 36, and the epitaxial layer 32 of n doped material. As indicated at FIG. 2 the $n^+$ doped regions 42 and 44 are encompassed, except at their surfaces 32*a*, by the p doped regions 34 and 36, respectively. Also, as shown, metal is deposited, as a vapor under vacuum, by conventional techniques and makes contact with exposed surfaces where openings, or windows, are etched through a silicon dioxide film 38 normally present on the surface 32*a* of the n doped layer 32. The deposited metal is patterned to form metallization regions which are designated at FIG. 2 by the reference numbers 46, 48, 50, 52, 54, 56 and 58. The metallization region 58 is deposited on the $n^+$ doped substrate on the surface 30*a* thereof. In FIG. 2 the metallization regions 46 and 56 are shown, schematically, as being electrically connected and forming the commonly connected terminals 25 and 25*a* of the circuit of FIG. 1; the metallization region 48 forms part of an electrical contact means for the commonly connected terminals 23 and 23*a* of the circuit of FIG. 1; the metallization regions 50 and 54 are shown, schematically, as being electrically connected and forming the commonly connected terminals 19 and 19*a* of the circuit of FIG. 1; the metallization region 52 forms part of an electrical contact means for the commonly connected terminals 21 and 21*a* of the circuit of FIG. 1; and, the metallization region 58 forms part of an electrical contact means for the terminal 18 of FIG. 1.

One form of fabrication of the monolithic semiconductor structure 20 also includes additional $n^+$ doped regions 53*a* . . . 53*e* diffused into the surface 32*a* of the grown layer 32. Each of the additional $n^+$ doped regions 53*a* . . . 53*e* begins at the surface 32*a* of n doped layer 32 and extends deeply into the n doped layer 32 for a distance toward, but not meeting, the surfacd 30*b* of substrate 30; said additional $n^+$ doped regions 53*a*, 53*b* and 53*c* are arranged and distributed, as shown in FIG. 2, in the layer 32 so as to individually and jointly surround each of the p doped regions 34 and 36 and form $n^+$ isolation diffusion regions between said p doped regions 34 and 36. Also, additional $n^+$ doped regions 53*c*, 53*d* and 53*e* are located in layer 32 so as to individually and jointly surround the additional p doped regions 60*a* . . . 60*d* which form guard rings for the Schottky-barrier diodes. The $n^+$ doped regions 53*a* and 53*e*, at the extremities of the n doped layer 32, form channel stoppers.

The additional p doped regions 60*a*, 60*b*, 60*c* and 60*d* are diffused into the surface 32*a* of the grown layer 32 and, as shown at FIG. 2, extend deeply into layer 32 toward, but not meeting, the surface 30*b*. The p doped regions 60*a* . . . 60*d* form guard rings for the Schottky-barrier diodes SBD1 and SBD2. The metallization regions 54 and 56 comprising the anodes of the respective Schottky diodes. The purpose of the guard rings is set forth hereinbefore. Also, an alternative mesa etch technique may be used for forming the diodes in the monolithic structure 20.

An exemplary method chosen to construct the monolithic semiconductor power structure is the epitaxial collector, double-diffused method for npn power transistors. The $n^+$ region 30 is, normally, a homogeneous heavily phophorous-doped silicon slice with a typical resistivity of 0.01 Ωcm. The epitaxially grown layer 32 is homogeneous and more lightly doped (e.g., 3Ωcm) so as to have the desired breakdown voltage characteristics. Any column V impurities used in conventional epitaxial growth may be used; e.g., P, As, Sb. The p doped regions are formed with a column III impurity; e.g., normally boron, but not restricted thereto. Conventional predeposition and drive-in process steps are followed to achieve a complimentary error function diffusion profile, as is customary. The $n^+$ doped regions 42, 44 and 53*a* . . . 53*e* may be formed simultaneously by a single diffusion of a column V impurity (typically, P) at a higher concentration than the resultant surface impurity concentration of the regions 34 and 36. The metal used for regions 46 . . . 56 is typically Al, but any metal system forming ohmic or degenerate contacts to both p and $n^+$ regions may be used.

A comparison of the circuit shown at FIG. 1 with the structure shown at FIG. 2 indicates that: terminals 25 and 25*a* (metallization regions 46 and 56) is a junction point for the emitter of transistor Q1 and the anode of Schottky-barrier diode SBD1; the terminals 23 and 23*a* (metallization region 48) is a junction point for the base of transistor Q1; terminals 19 and 19*a* (metallization regions 50 and 54) is a junction point for the emitter of transistor Q2 and the anode of Schottky-barrier diode SBD2; terminals 21 and 21*a* (metallization region 52) is a junction point for the base of transistor Q2; terminal 18 (metallization region 58 is a junction point for the collectors of transistors Q1 and Q2 as well as for the cathode of diodes SBD1 and SBD2.

Thus the monolithic structure 20 as combined with the discrete unit 22 forms a rectifier suitable for being connected between a transformer T1 and the parallel RC combination, as shown in FIG. 1.

The distributed diffused $n^+$ doped regions 53*a* . . . 53*e*, as shown at FIG. 2, are selectively placed around and between the various p doped regions to form a channel stopper as well as to form stoppers between the p doped regions to reduce lateral pnp action by the reduction of lifetime.

Since transistors Q1 and Q2 are to be operated in an inverted mode it is desirable to improve transistor inverse gain. This may be achieved by improving the injection efficiency of the epitaxially grown n doped layer 32 by making it as thin as possible and as highly doped as possible without, however, sacrificing breakdown characteristics. Furthermore, the forward emitters may be doped more lightly, as well as the base regions, in order to improve inverse gain. Other design parameters may be varied to achieve high inverse gain. For example, the emitter areas could be increased and epitaxial bases could be employed to eliminate the doping gradient and provide a lower and more accurately controlled resistivity in order to improve injection from the epitaxial collectors.

Although the foregoing description and accompanying drawing figures illustratively describe the invention, it is to be understood that the foregoing description and the drawing figures are purposeful for providing examples of the invention. Many changes may be made without departing from the spirit of the invention, or from the scope of the claims hereinafter set forth.

What is claimed is:

1. A hybrid circuit, suitable for being electrically connected between a power transformer including a secondary winding with a grounded center-tap terminal between two end terminals of said secondary winding and a load including a first terminal and a grounded second terminal, for converting an alternating voltage existing across said secondary winding to d.c. and supplying d.c. to said load, said hybrid circuit comprising: a discrete multi-winding current control transformer unit in combination with a monolithic semiconductor structure; said transformer unit comprising a magnetic core member on which a first primary winding, a first secondary winding, a secondary primary winding and a second secondary winding are wound and magnetically coupled, each of the aforesaid primary and secondary windings having one and other ends, said one ends of the first primary and the first secondary windings having opposite winding polarities and being electrically connected and defining a first input terminal of the hybrid circuit, said one ends of the second primary and the second secondary windings having winding polarities opposite to each other as well as opposite to the corresponding one ends of the first primary and the first secondary windings, said one ends of the second primary and second secondary windings being electrically connected and defining a second input terminal of the hybrid circuit; said monolithic, semiconductor circuit structure comprising an $n^+$ doped substrate having first and second back-to-back surfaces, an n doped layer epitaxially grown on said first surface of the substrate, said n doped layer having a surface in back-to-back relation with said first surface of the substrate on which the layer is grown, first and second p doped regions diffused in and laterally spaced along said layer and extending from the surface of said layer into said layer toward, but not meeting, the substrate, first and second $n^+$ doped regions, each being diffused into a different one of the first and second p doped regions and extending from the surface of the p doped region into said p doped region toward, but not meeting, the interface between the p doped region and the n doped layer, each $n^+$ doped region encompassed, except at the surface thereof, by the p doped region in which it is diffused, first and second laterally spaced metallization regions deposited on and intimately bonded to said surface of the n doped layer and forming thereat first and second metal-semiconductor junctions, said first and second metallization regions comprising anodes of first and second Schottky-barrier diodes, respectively, said first and second $n^+$ doped regions comprising emitters of first and second npn transistors, respectively, said first and second p doped regions comprising bases of said first and second npn transistors, respectively, said second surface of said $n^+$ doped substrate comprising common collectors of said first and second npn transistors as well as common cathodes of said first and second Schottky-barrier diodes, first means electrically connecting said surface of said first $n^+$ doped region and said first metallization region, second means electrically connecting said surface of said second $n^+$ doped region and said second metallization region, said first means being electrically connected to said other end of said first primary winding, said second means being electrically connected to said other end of said second primary winding, third means electrically connecting said first p doped region to said other end of said first secondary winding, and fourth means electrically connecting said second p doped region to said other end of said second secondary winding, said second surface of said $n^+$ doped substrate defining a first output terminal of the hybrid circuit, said hybrid circuit being connectable between the power transformer and the load such that the first and second input terminals of the hybrid circuit are connectable to the end terminals, respectively, of the secondary winding of the power transformer and the second surface of the $n^+$ doped substrate defining the first output terminal of the hybrid circuit is electrically connected to said first terminal of the load.

2. The hybrid integrated circuit set forth in claim 1 wherein said monolithic semiconductor circuit structure is further comprised of an additional $n^+$ doped region diffused into said n doped layer beginning at the surface thereof and extending into said n doped layer toward, but not meeting, the surface of the substrate on which said n doped layer is epitaxially grown, said additional $n^+$ doped region being arranged and distributed in said n doped layer so as to individually surround each of said first and second p doped regions and form $n^+$ isolation diffusions between said p doped regions as well as an $n^+$ doped isolation diffusion surrounding both said p doped regions.

* * * * *